US007463110B2

(12) United States Patent
Lapierre et al.

(10) Patent No.: US 7,463,110 B2
(45) Date of Patent: Dec. 9, 2008

(54) TRANSITION DEVICE BETWEEN A WAVEGUIDE AND TWO REDUNDANT CIRCUITS COUPLED EACH TO A COPLANAR LINE

(75) Inventors: Luc Lapierre, Toulouse (FR); Jerome Puech, Toulouse (FR); Odile Picon, Paris (FR); Ahlem Ramdane, Noisy le Grand (FR); Elodie Richalot-Taisne, Neuilly sur Marne (FR)

(73) Assignee: Centre National d'Etudes Spatiales (C.N.E.S.), Paris (FR)

( * ) Notice: Subject to any disclaimer, the term of this patent is extended or adjusted under 35 U.S.C. 154(b) by 174 days.

(21) Appl. No.: 11/629,303

(22) PCT Filed: Jun. 15, 2005

(86) PCT No.: PCT/FR2005/001491

§ 371 (c)(1),
(2), (4) Date: Feb. 16, 2007

(87) PCT Pub. No.: WO2006/005841

PCT Pub. Date: Jan. 19, 2006

(65) Prior Publication Data

US 2007/0285143 A1 Dec. 13, 2007

(30) Foreign Application Priority Data

Jun. 17, 2004 (FR) .................................. 04 06596

(51) Int. Cl.
*H03H 5/00* (2006.01)
*H03H 7/38* (2006.01)
*H01P 1/10* (2006.01)
*H01P 5/12* (2006.01)

(52) U.S. Cl. .......................... 333/26; 333/33; 333/105; 333/262

(58) Field of Classification Search ............... 333/21 A, 333/21 R, 26, 33, 105, 262
See application file for complete search history.

(56) References Cited

U.S. PATENT DOCUMENTS 6,002,305 A * 12/1999 Sanford et al. ................ 333/26

(Continued)

FOREIGN PATENT DOCUMENTS

GB 0050393 * 4/1982

(Continued)

OTHER PUBLICATIONS

Cavanna T et al: "W band technologies for data collection experiment of the david mission" 2003 IEEE Aerospace Conference, vol. 1, Mar. 8, 2003, pp. 263-269, XP010660285 figures 1, 3.

(Continued)

*Primary Examiner*—Robert Pascal
*Assistant Examiner*—Gerald Stevens
(74) *Attorney, Agent, or Firm*—Young & Thompson

(57) ABSTRACT

A redundant transition device between a waveguide (1) and at least two redundant processing circuits (2, 3) includes two uncoupled coplanar lines (5, 6) formed one on either side of a single substrate plate (4) and extending, in part at least, into the waveguide (1). Each coplanar line (5) has a longitudinal end (17) for connection to one (2) of the processing circuits, and a longitudinal transfer end (16), adapted to channel an electromagnetic wave between the waveguide and the slots (21, 22) of the coplanar line. Each coplanar line (5, 6) is provided with a phase shifting element (25, 26), for inverting the phase of an electric field on one side of the central transmission strip (7, 10) of the coplanar line.

25 Claims, 3 Drawing Sheets

Figure 1:
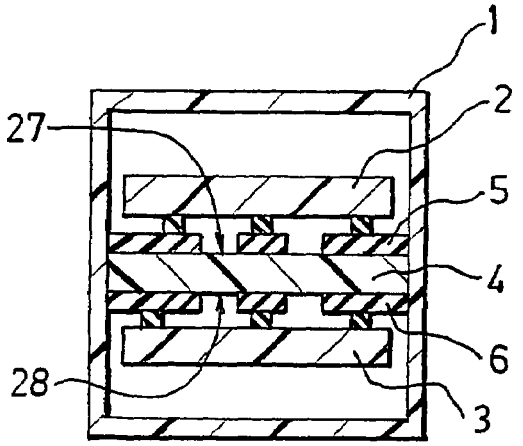

U.S. PATENT DOCUMENTS 6,573,810 B2 6/2003 Ulian et al.

FOREIGN PATENT DOCUMENTS

WO 93/22802 11/1993

OTHER PUBLICATIONS

T. Hatsuda: "Computation of Coplanar-Type Strip-Line Characteristics by Relaxation Method and Its Application to Microwave Circuits" IEEE Transactions on Microwave Theory and Techniques, vol. 23, No. 10, Oct. 1975 pp. 795-802, XP002309073 figure 1B.

Dubuc D et al: "Original MEMS-based single pole double throw topology for millimeter wave space communications" European Microwave Conference, vol. 3, Oct. 7, 2003, pp. 979-982, XP010680815 dited in the application the whole document.

Bedair et al: Fast and Accurate Analytic Formulas for Calculating the Parametes of a General Broadsice-Coupled Coplanar Waveguide for (M) MIC Applications 1989 IEEE Transactions on Microwave Theory and Technologies, vol. 37, No. 5, May 1989 pp. 843-850.

Chen et al: Analysis of Bilateral Coplanar Waveguides Printed on Anisotropic Subsrates for Use in Monolithid MICsIEEE Transactions on Microwave Theory and Technologies, vol. 41, No. 9, Sep. 1993 pp. 1489-1493.

* cited by examiner

TRANSITION DEVICE BETWEEN A WAVEGUIDE AND TWO REDUNDANT CIRCUITS COUPLED EACH TO A COPLANAR LINE

The invention relates to a transition device between a waveguide and at least two redundant circuits, called processing circuits, for processing signals received and/or transmitted by the waveguide, each processing circuit being coupled to its own coplanar line.

The device according to the invention is, for example, intended to be combined with a waveguide of an antenna for receiving microwave frequency electromagnetic waves (in the Ka band for example), as part of a receiving system, in the field of space communications. The processing circuits are, for example, low noise amplifier (LNA) circuits, intended to amplify a signal received by the waveguide of the antenna. The device according to the invention is also suitable for other applications (terrestrial, for example) for receiving electromagnetic waves in other frequency bands. It is also suitable for applications for transmitting electromagnetic waves (over long distances in some cases) by means of a waveguide, based on signals processed by a processing circuit.

The term "waveguide" usually denotes a hollow tube having a rectangular or if necessary circular cross section for example, made from an electrically conducting material, said tube being capable of confining and transporting electromagnetic waves in a longitudinal direction of said tube, called the longitudinal direction of propagation.

Additionally, the term "coplanar line" usually denotes a microwave frequency circuit comprising three parallel strips of conducting material, which all extend in the same plane on a substrate layer of dielectric material, namely a central strip, called the central transmission strip, and two lateral strips connected to ground, called the lateral ground strips. Coplanar lines are suitable for carrying electromagnetic energy toward and/or from semiconductor integrated circuits. There are other types of microwave circuits capable of carrying electromagnetic energy in a planar way, but coplanar lines are particularly preferred because of their coplanar structure which facilitates the connection of processing circuits ("flip-chip" mounting, etc.) and offers low losses at high frequency.

These two technologies (waveguide/coplanar line), whose operating modes differ from each other, are installed together within a receiving and/or transmitting system: the waves transmitted through space are received and/or transmitted by an antenna using waveguide technology; a coplanar line is used to transmit a corresponding signal to and/or from a processing circuit. Between these two types of energy transmission, a transition device is required to convert the waveguide mode to coplanar mode (or vice versa).

WO 93/22802 describes a transition device between a receiving waveguide of rectangular cross section and a single coplanar line, which can supply an amplifier circuit, for example. The coplanar line is arranged orthogonally to the longitudinal direction of propagation of the waveguide, outside the latter; it is extended by a probe into the waveguide to ensure the transition of the signal.

This transition device between a waveguide and a processing circuit using a single coplanar line has the drawback of providing no redundancy. The receiving system becomes totally inoperative if there is a failure of a component of the single amplifier circuit supplied by said coplanar line, or if there are imperfections in the coplanar line or if the line is damaged.

The invention is intended to overcome this drawback by proposing a redundant transition device between a waveguide and at least two redundant processing circuits, each coupled to its own coplanar transition line. In both reception and transmission, the signal must be processed by only one processing circuit at a time, and at any instant the signal must be transmitted by only one coplanar line at a time, this line then being called the "active coplanar line". In reception, this constraint is based on the assumption that it is possible to choose the coplanar line that is to be active, according to the state of each of the processing circuits, and to neutralize the other coplanar line, which is then called the inactive coplanar line.

There are known redundant topologies using coplanar lines, called single pole double throw topologies, such as those described in the publication "*Original MEMS-based single pole double throw topology for millimeter wave space communication*" (David Dubuc et al., LAAS-CNRS, UPS and Alcatel Space Industries, European Conference on Microwaves, Munich 2003). The topology which is described comprises an upstream coplanar line which divides into two parallel branches on the same face of a substrate, each branch forming a downstream coplanar line. One of the downstream lines, called the parallel coplanar line, is provided with a quarter-wave inverter followed by a microelectromechanical switch, called a MEMS or a MEM switch, connected in parallel. The other downstream line, called the series coplanar line, is provided with a MEMS connected in series. Each downstream coplanar line carries and supplies, downstream of the MEMS, an amplifier circuit composed of a filter and two low-noise amplifiers. In normal operation, neither of the two MEMS is activated (in other words, neither of the MEMS is switched on), and the operating amplifier circuit is the one supplied by the parallel coplanar line. If this amplifier circuit fails, the two MEMS are activated (switched on) to enable the amplifier circuit of the series line to be used; the parallel coplanar line is short-circuited and is therefore neutralized, and the series coplanar line, closed by its MEMS, becomes conductive and therefore active.

This topology is used as a low-noise redundant front-end circuit in a high-reliability space repeater. It forms a redundant transition device between an upstream coplanar line and the two low-noise amplifier circuits which it carries.

In addition to the fact that it does not provide a transition between a waveguide and two amplifier circuits, this known topology has a relatively large width, due to the presence of the two downstream coplanar lines side by side. It should be noted that, throughout the following text, the term "width" of a coplanar line or of a topology formed by coplanar lines or of an element of a coplanar line denotes a dimension of said line or topology or element in one direction, called the transverse direction, which is orthogonal to the longitudinal direction of the coplanar line(s) and parallel to the plane of said line(s).

The width of this known topology (the single pole double throw topology) is incompatible with its incorporation into certain space receiver systems which have only a limited amount of capacity for the incorporation of a redundant amplifier system. There is consequently a need for redundant transition devices with small overall dimensions, a need which has not yet been met.

In this context, the invention is intended to propose a redundant transition device between a waveguide and at least two independent redundant processing circuits, each coupled to a coplanar line, this transition device being capable of providing redundancy in order to counter any failure of one of the processing circuits or any damage suffered by one of the coplanar lines, while also having small overall dimensions.

It should be noted that the invention is also intended to provide a number of redundant transition devices suitable for electromagnetic wave reception applications, in which the device provides for the transition of a signal received by the waveguide to the operative processing circuit, equal to the number of redundant transition devices suitable for electromagnetic wave transmission applications, in which the device provides for the transition of a signal transmitted by the operative processing circuit to the waveguide.

A specific object of the invention is to provide a redundant transition device between a waveguide of a satellite antenna for receiving microwave frequency waves and two low-noise amplifier circuits.

The invention is also intended to provide a transition device which is more compact and which is specifically capable of being incorporated into a receiving system having a multiple antenna, such as an antenna known as a FAFR (Focal Array Fed Reflector) antenna. For this purpose, the waveguide and the associated redundant transition device must have a transverse dimension smaller than the distance between the elementary antennae of the FAFR antenna. In particular, the invention is intended to provide a waveguide and an associated redundant transition device whose cross section is less than about ten millimeters when they are designed for use with a multiple antenna for receiving waves at frequencies in the range from 27 to 31 GHz (the Ka band).

Another object of the invention is to provide a redundant transition device having an improved performance in terms of the quality of transition and transmission of the signal to the processing circuits or from the latter (reduced loss, low noise, etc.). In particular, the invention is intended to provide a device in which the losses in the transition between the waveguide and each coplanar line and the losses along said coplanar lines are very low. The invention is intended to provide a device meeting the particularly severe requirements of space communications.

Another object of the invention is to provide a redundant transition device having a wider band of operating frequencies. The invention is also intended to offer a range of transition devices, each adapted to a specified frequency band.

Another object of the invention is to provide a redundant transition device for a receiving system, which is capable of transmitting a signal to only one of the processing circuits at a time, and also of transmitting the same signal regardless of which processing circuit is operative. In particular, the invention proposes a transition device which can provide the same electric field phase term and the same impedance at the input of the two processing circuits (the phase and impedance seen from said circuits), as well as the same electric field phase term at the input of the waveguide (the phase seen from said guide).

The invention is also intended to achieve all these objects by proposing an inexpensive transition device, whose production costs (in terms of methods and materials used, etc.) are limited.

The invention relates to a redundant transition device between an electromagnetic waveguide and at least two redundant circuits, called processing circuits, this transition device comprising two coplanar lines formed on a plate, called a substrate, of dielectric material. Each coplanar line comprises, in a same plane, a central transmission strip and two lateral ground strips, one on each side of said transmission strip, separated from the latter by electromagnetic waveguide slots, said transmission strip and ground strips extending primarily in a direction called the longitudinal line direction. Each coplanar line has a longitudinal end, called the connection end, for coupling to one of the processing circuits associated with said coplanar line.

The device according to the invention wherein:

- the two coplanar lines extend one on each side of a single substrate, on two principal opposite faces thereof,
- the two coplanar lines extend, in part at least, into the waveguide;
- each coplanar line has a longitudinal end, called the transfer end, opposite its connection end, adapted to channel an electromagnetic wave between the waveguide and the slots of said coplanar line;
- each coplanar line is provided with means, called phase shifting means, adapted for inverting the phase of an electric field on one side of the central transmission strip of said coplanar line, in order to transmit electrical energy essentially in a coplanar mode along said transmission strip between the phase shifting means and the processing circuit, and to transmit electrical energy essentially in a guide mode in the waveguide beyond the transfer end.

For the sake of simplicity, this description is intended to describe the propagation of electric fields in the device according to the invention, bearing in mind that an electromagnetic wave is composed of an electric field and a magnetic field, and that most of the described phenomena also relate to magnetic fields.

It should be noted that the expression "to invert the phase of an electric field" means to increase or decrease the phase term of said field by $\pi$. In "coplanar mode", the electric fields propagated in the slots of the coplanar line have inverted phases; they induce an electric current in the central transmission strip of said coplanar line. The "guide mode" refers to a mode of propagating an electric field in a waveguide, such as the mode called TE10, for example. The expression "beyond the transfer end" means, respectively, upstream of the transfer end in reception and downstream of the transfer end in transmission (in other words outside the coplanar line), the terms "upstream" and "downstream" referring to the direction of the propagation of the waves and therefore of the signal. In reception, a received electric field is therefore propagated in guide mode in the waveguide, and is then led toward the slots of a coplanar line according to the invention via the transfer end of said line, the resulting fields propagating in these slots in coplanar mode downstream of the phase shifting means. Upstream of the phase shifting means, two cases can be present, depending on the position of said means. If the line phase shifting means are located at a distance, downstream, from its transfer end, the electric fields entering the slots of the line at the output of the transfer end are propagated to the phase shifting means in a mode called slot mode, in which they have the same phase and do not induce any current in the transmission strip. The slot mode is a parasitic mode, which can be at least partially converted to coplanar mode by the phase shifting means according to the invention (the proportion of electrical energy transmitted in coplanar mode by the line, downstream of the phase shifting means, being predominant by comparison with that transmitted in slot mode). If the phase shifting means of the line are located at its transfer end, the field is propagated in guide mode upstream of the phase shifting means. In other words, the change from guide mode to coplanar mode is made either directly (if the phase shifting means are placed at the transfer end) or via the slot mode (if the phase shifting means are placed at a distance downstream of the transfer end). The preceding remarks are also applicable to transmission, if the direction of propagation of the field and the terms "upstream" and "downstream" are reversed.

The device according to the invention therefore essentially comprises two coplanar lines formed (by engraving for example) on either side of a substrate, and positioned (at least partially) inside a waveguide. The use of this architecture as a redundant transition device is completely contrary to the expectations of those skilled in the art.

This is because there are already known topologies comprising two coplanar lines formed facing each other, one on each side of a layer of dielectric material. But these known topologies (called couplers) are used only to exploit the coupling phenomena which occur between the two coplanar lines, possibly for the purpose of transmitting a signal from one line to the other.

These coupling phenomena are illustrated and quantified, for example, in the publication "*Fast and accurate analytic formulas for calculating the parameters of a general board-side-coupled coplanar waveguide for* (*M*)*MIC applications*" (Said S. Bedair et al., IEEE Transactions on Microwave Theory and Techniques, vol. 37, No. 5, May 1989), in the case of two symmetrical coplanar lines, each surmounted at a distance by a metal plate, the space between the dielectric substrate and each metal plate being suitable for filling with another dielectric material. The publication "*Analysis of bilateral coplanar waveguides printed on anisotropic substrates for use in monolithic MICs*" (Yinchao Chen et al., IEEE Transactions on Microwave Theory and Techniques, vol. 41, No. 9, September 1993) is more specifically based on the effects of the anisotropy of the substrate on the dispersion (coupling) properties of an open or protected bilateral coplanar waveguide.

The coupling of the two coplanar lines is totally opposed to their use in the context of a redundant transition device, the operation of which requires that the electrical energy received (from the waveguide or from the processing circuits) by the active coplanar line be transmitted along this line with the fewest possible losses, and specifically with a minimum of losses by partial transfer to the other coplanar line.

The possibility of using two coplanar lines, formed on two opposite faces of a substrate, as part of a redundant transition device is therefore totally unpredicted. Against all expectations, the inventors have demonstrated that the coupling phenomena can be considered negligible, particularly along the dimensions of the coplanar lines and of the substrate.

Depending on the desired operating frequency (or wavelength) bands of the transition device, it is thus possible to specify, in particular, a range of thicknesses of the substrate, according to the material chosen and its electrical permittivity $\in_r$, as well as a range of coplanar line lengths, for which the coupling of the two coplanar lines can be considered negligible or acceptable for the application concerned. For example, in the case of a device according to the invention intended for a space communications application, which is particularly demanding, the nature and dimensions of the coplanar lines and the substrate are advantageously such that a parameter, known as the coupling parameter $S_{41}$, is less than −20 dB.

Additionally, in the device according to the invention, a signal received (in the form of electromagnetic waves) by the waveguide is directly transferred to one of the coplanar lines (and transmitted in the form of electric current to the processing circuit). Conversely, a signal transmitted (in the form of electric current) by a processing circuit is directly transferred (in the form of electromagnetic waves) to the waveguide by the coplanar line associated with said circuit. The overall length of the transition device is thus minimized. In particular, no supplementary intermediate coplanar line (such as an upstream line on the model of the single pole double throw topology mentioned in the introduction) is necessary to provide the transition between the waveguide and the active coplanar line. This results in a significant decrease in the losses occurring along the coplanar lines. Furthermore, since the two coplanar lines according to the invention are formed one on each side of the substrate, a smaller line length has the advantage of limiting the risks of coupling and any part of the electrical energy transmitted by the active line to the other line.

Finally, the maximum transverse dimension of a transition device according to the invention is equal to the maximum width of one and only one coplanar line. The device according to the invention, more compact than the known redundant topologies, can therefore be incorporated into a waveguide having a very small transverse dimension. It is suitable for multiple antennae of the FAFR type.

Advantageously, according to the invention, the two coplanar lines extend facing each other, one on each side of the substrate.

Advantageously, according to the invention, the two coplanar lines extend in a direction of propagation of the waveguide. In other words, the longitudinal direction of each coplanar line is parallel to the direction of propagation of the waveguide.

Advantageously, according to the invention, the substrate extends in a median longitudinal plane of the waveguide. The term "median longitudinal plane of the waveguide" denotes a plane containing the longitudinal direction of propagation of the waveguide and delimiting two equal parts of the waveguide. This characteristic contributes to the performance of the device according to the invention, given that the amplitude of an electric field carried by the waveguide is maximal in a central region of said guide.

Advantageously, according to the invention, each coplanar line is also provided with a switch for switching said coplanar line on or off. When the transition device is intended for an electromagnetic wave receiving system, said switches are also adapted to be controlled in such a way that the coplanar lines have opposite states, namely active and inactive, at each instant, to ensure that the received signal is transmitted on only one line at a time, towards a single processing circuit. When the transition device is intended for an electromagnetic wave transmission system, any switches are also adapted to be controlled in such a way as to activate at least the coplanar line associated with the operative processing circuit at each instant (activation of both coplanar lines is not excluded).

It should be noted that a coplanar line is called active when it is conducting, in other words capable of transmitting electrical energy by propagation of an electric field (in other words an electromagnetic wave) in its slots essentially in coplanar mode (and therefore by generating and circulating an electric current in its central transmission strip). A coplanar line is called inactive when it cannot transmit any electrical energy.

Advantageously, according to the invention, the transition device has a combination of the following characteristics:

one of the coplanar lines, called the series coplanar line, has an interrupted central transmission strip, formed from two separated portions extending into each others' continuation, the other coplanar line, called the parallel coplanar line, having a continuous central transmission strip, the switch of the series coplanar line, called the series switch, is connected in series so as to connect (structurally) the two separated portions of the central transmission strip, in such a way that the series coplanar line is active when the series switch is in a state, called the conducting state, in which it forms an electrical connection between the two portions of the central transmission strip; in particular, the series coplanar line is active when a voltage greater (in absolute terms) than a threshold activation voltage of the series switch is applied to said switch, said series line being inactive in the opposite case (in other words when the voltage applied to the series switch is lower (in absolute terms) than said threshold activation voltage); the series line is, in particular, inactive when no voltage is applied to the series switch, the switch of the parallel coplanar line, called the parallel switch, is connected in parallel so as to be capable of connecting the central transmission strip to at least one, and preferably both, of the lateral ground strips of said parallel coplanar line, in such a way that the parallel coplanar line is inactive, because it is neutralized by short-circuiting, when the parallel switch is in a state, called a conducting state, in which it forms an electrical connection between the central transmission strip and the lateral ground strip(s); in particular, the parallel line is inactive when a voltage greater (in absolute terms) than a threshold activation voltage of the parallel switch is applied to said switch, said parallel line being active in the opposite case (in other words when the voltage applied to the parallel switch is lower (in absolute terms) than said threshold activation voltage); in particular, it is active when no voltage is applied to the parallel switch.

In one version of the invention, at least one, and preferably each, switch comprises a diode. In particular, the series switch is formed by a diode; the parallel switch is formed by a first diode connecting the central transmission strip of the parallel coplanar line to one of its lateral ground strips, and a second diode connecting said transmission strip to the other lateral ground strip of said parallel coplanar line.

As a variant, or in combination, at least one, and preferably each, switch is a microelectromechanical switch, called an MEM switch.

Preferably, both switches are of the same type (diode or MEMS).

Advantageously, according to the invention, in the case in which the coplanar lines face each other, the switches of the two coplanar lines are offset along a longitudinal direction of the substrate (which coincides with the longitudinal directions of the two lines when the opposite faces of the substrate are parallel), by a relative distance substantially equal to one quarter of a wavelength called the guided wavelength of the device ($\lambda/4$). The term "guided wavelength of the device ($\lambda$)" denotes a central wavelength (in the frequency band) which the coplanar line is capable of transporting and is intended to transport, this guided wavelength depending on the reception and/or transmission frequency band of the waveguide and on the permittivity of the substrate.

This relative positioning of the switches makes it possible to set the same phase term at the input of the waveguide (the phase seen from the waveguide) for the electric field reflected by the two coplanar lines, particularly in reception and in the case in which both coplanar lines are inactive (in which case the parallel coplanar line is closed by a short circuit, while the series coplanar line is open).

In a variant, the coplanar lines are offset along the longitudinal direction of the substrate by a relative distance substantially equal to $\lambda/4$, while the distance between each switch and the transfer end of the corresponding coplanar line is substantially the same for both coplanar lines.

Advantageously, according to the invention, at least one lateral ground strip of at least one, and preferably each, coplanar line has, at the transfer end of said line, a terminal edge, called the transfer edge of said strip, which extends obliquely by departing transversely and longitudinally from a central part of the coplanar line. In other words, the lateral ground strip terminates in an end, called the transfer end of said strip, in the form of a point beveled toward the outside (the point is on a lateral edge of the strip).

In a preferred version of the invention, each of the two lateral ground strips of each coplanar line has an oblique transfer edge, as described above. Each of these edges extends preferably by projecting from the central transmission strip in the longitudinal direction of the line.

The oblique transfer edge(s) of the lateral ground strips guide the electromagnetic wave progressively between the walls of the waveguide and the slots of the coplanar line, and make it possible to change from one transmission mode to another (the guide mode in the waveguide, the slot or coplanar mode in the coplanar line).

The oblique edge can be straight or curved in a shape (rounded, exponential, or preferably hyperbolic, etc.) optimized so as to limit the phenomena of reflection of the electric field.

Similarly, the transmission strip of at least one, and preferably each, coplanar line has, at the transfer end of said line, a terminal edge, called the transfer edge of the transmission strip, forming a point. It should be noted that the longitudinal end of the strip, delimited by this transfer edge, is called the transfer end of the transmission strip.

In a preferred version, the central strip has a transfer edge in the form of a point, and the two lateral strips have oblique transfer edges. This configuration is particularly advantageous in reception, since it makes it possible to limit considerably the part of the electric field flux (transmitted by the waveguide) which is reflected toward the waveguide by the frontal edge of the coplanar line at its transfer end, this frontal edge being formed by the transfer edges of the lateral strips and of the central strip. It is also advantageous in transmission, where it promotes the transfer of the electric field from the slots of the active coplanar line toward the waveguide and the change from one transmission mode to the other.

Advantageously, according to the invention, the phase shifting means of the coplanar lines are adapted to invert the phase of an electric field on opposite sides of the central transmission strips. In other words, if we consider a longitudinal median plane substantially orthogonal to the faces of the substrate and passing through the two central strips of the coplanar lines (these strips extending substantially facing each other), the phase shifting means of one of the lines act on the electric field on one side of this median plane, while the phase shifting means of the other line act on the electric field on the other side of this median plane. The inventors have demonstrated that any coupling phenomena can be reduced further by this arrangement of the phase shifting means.

Advantageously, according to the invention, the phase shifting means have one or more of the following characteristics:

the phase shifting means of at least one, and preferably each, coplanar line comprise a lateral extension of the central transmission strip of said coplanar line, called a lateral phase shifting extension, in particular, the phase shifting means of the coplanar line are formed by a single lateral phase shifting extension of its central transmission strip which can create a phase shift of about $\pi$, in a variant, the phase shifting means of the coplanar line are formed by two consecutive lateral extensions (in the longitudinal direction of the line) of its central transmission strip, which extend on the same side of said strip. In this case, each lateral phase shifting extension is adapted to create a phase shift of the electric field of about $\pi/2$, making it possible to provide lateral extensions having a smaller width (transverse dimension). This coplanar line therefore has a smaller overall transverse dimension, enabling it to be incorporated into waveguides having very small transverse dimensions. On the other hand, the presence of two consecutive phase shifting extensions makes it necessary to design a longer coplanar line. The additional losses attributable to the line length are partially compensated by the decrease in those attributable to the eccentricity (in other words the width) of the phase shifting means. Furthermore, the coupling (which increases with the line length) can be limited, if necessary, simply by increasing the thickness of the substrate;

at least one lateral phase shifting extension of a central transmission strip is rectangular in shape;

as a variant, or in combination, at least one lateral phase shifting extension of a central transmission strip is trapezoidal in shape;

as a variant, or in combination, at least one lateral phase shifting extension of a central transmission strip takes the form of a portion of a disk, for example a half-disk. This shape appears to improve unexpectedly the performance of the coplanar line (with a marked decrease of the residual proportion of the slot mode with respect to the coplanar mode downstream of the extension, a reduction of losses, etc.).

In a variant, the transfer end of at least one, and preferably each, coplanar line is asymmetric: at this end, one of the lateral ground strips of the line forms a projecting longitudinal extension, along the longitudinal direction of the line, of the other lateral ground strip and of the central transmission strip of the coplanar line. In other words, the lateral ground strips of the line have transfer edges (preferably both oblique, as explained above) which are offset along the longitudinal direction. The phase shifting means of such a coplanar line comprise, on the one hand, said longitudinal extension of the lateral ground strip, and, on the other hand, a bridge of conducting material, called an air bridge, crossing over the central transmission strip and connecting the two lateral ground strips, this bridge being preferably positioned in the immediate proximity of the transfer end of the transmission strip.

In all cases, the phase shifting means of the two coplanar lines are preferably of the same type (single lateral extension or double lateral extension of the transmission strip or asymmetry of the transfer end of the line associated with an air bridge).

As a general rule, the coplanar lines are preferably identical (with the exception of any discontinuity of the central strip of one of the lines), so that identical reception or transmission of signals is obtained, regardless of which processing circuit is operative. Similarly, the substrate is preferably homogeneous and isotropic, or at least symmetrical about a longitudinal median plane extending between its principal faces, so that it has the same electrical permittivity on each of its faces.

When the transition device is intended for a reception system in the space field, each of the processing circuits comprises at least one low-noise amplifier, called an LNA amplifier, mounted in "flip-chip" mode on the associated coplanar line, at the connection end of the latter.

Advantageously, according to the invention, the central transmission strip and the slots of each coplanar line have respective nominal widths adapted to make the input impedance of the processing circuit optimal in terms of noise limitation, these widths depending on the electrical permittivity of the substrate. In particular, the central transmission strip and the slots of each coplanar line have respective nominal widths adapted to make the input impedance of the LNA amplifier substantially equal to 50 Ω. It should be noted that the term "nominal width of a slot" denotes a mean width of the slot, and the term "nominal width of a central transmission strip" denotes a mean width of the strip, excluding any lateral phase shifting extension(s) which it may have.

The central transmission strips (or the slots) of the two coplanar lines preferably have the same width, in order to create the same input impedance of the two processing circuits, for identical reception of the signal regardless of which coplanar line is active and which processing circuit is operative.

In a preferred version of the invention, in the case of a transition device specifically adapted to an antenna for receiving microwaves at frequencies in the range from 27 to 31 GHz (the Ka band), the substrate has an electrical permittivity $\in_r$ of less than 5 and a thickness of more than 0.5 mm, each coplanar line has a central transmission strip with a length of less than 3.5 mm between the phase shifting means and a first point of connection of the transmission strip to the processing circuit (the portion of the strip along which propagation takes place in coplanar mode); it should be noted that this coplanar transmission length of the transmission strip is equally suitable for a transmission device;

each coplanar line has a central transmission strip having a nominal width in the range from 10 to 170 μm and slots having a nominal width in the range from 10 to 150 μm, to provide an input impedance of 50 Ω of the processing circuit; the line can have larger nominal widths of the transmission strip and slots for a greater impedance (75 or 100 Ω for example).

In the case of a transition device specifically adapted for an antenna for receiving microwaves at frequencies in the range from 45 to 50 GHz (the Q band), the substrate has an electrical permittivity $\in_r$ of less than 5 and a thickness of more than 0.5 mm, each coplanar line has a central transmission strip with a length of less than 3 mm between the phase shifting means and a first point of connection to the processing circuit, each coplanar line has a central transmission strip with a width in the range from 10 to 170 μm, and slots with a width in the range from 10 to 150 μm.

The invention also relates to a transition device wherein some or all of the characteristics mentioned above and below are in combination.

Figure 2:
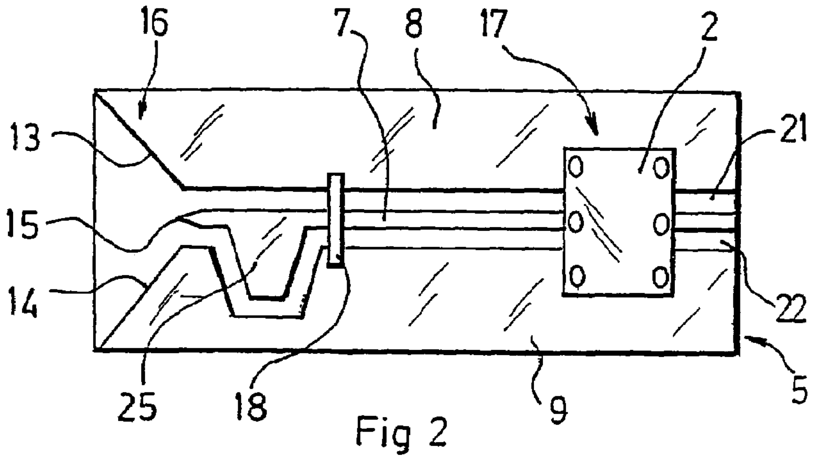
Figure 3:
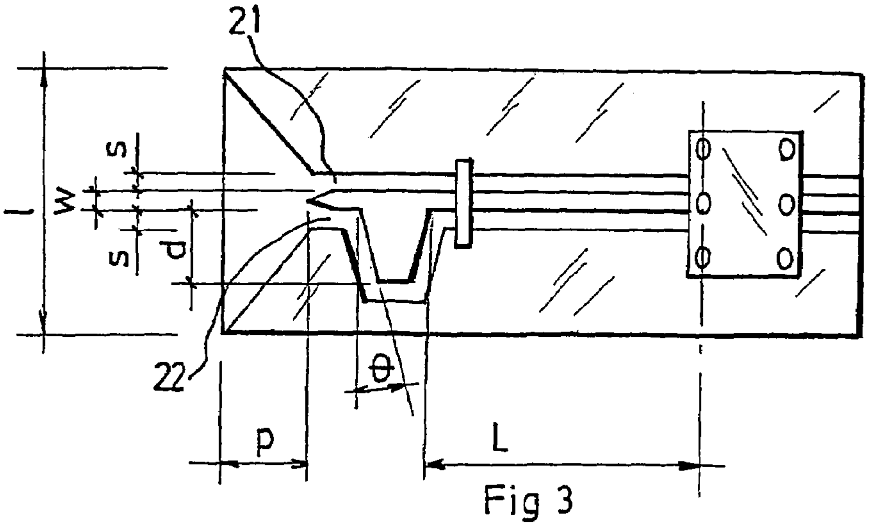
Figure 4:
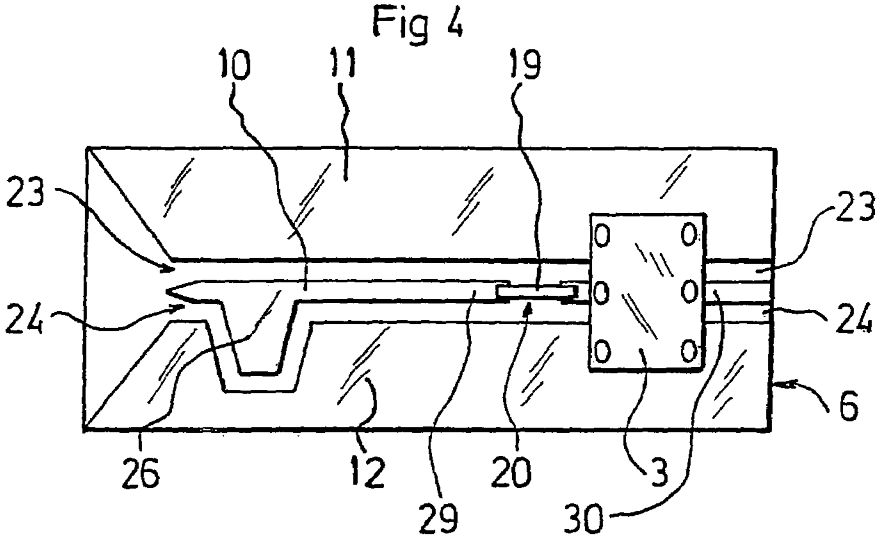
Figure 5:
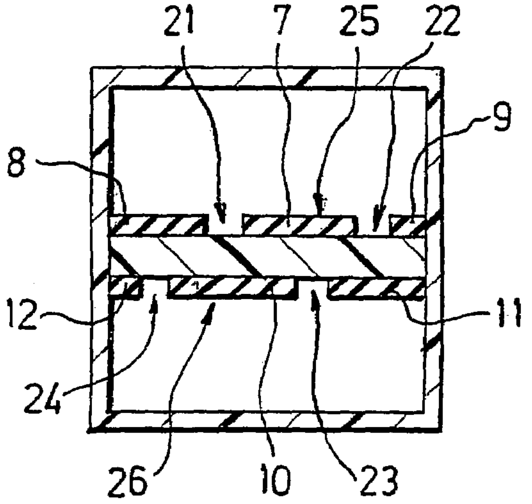
Figure 6:
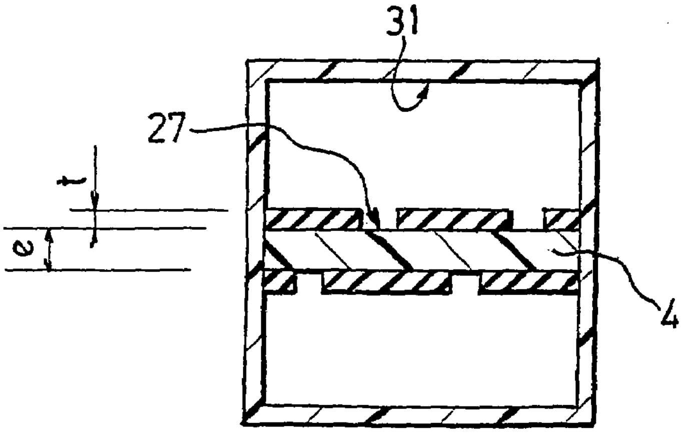
Figure 7:
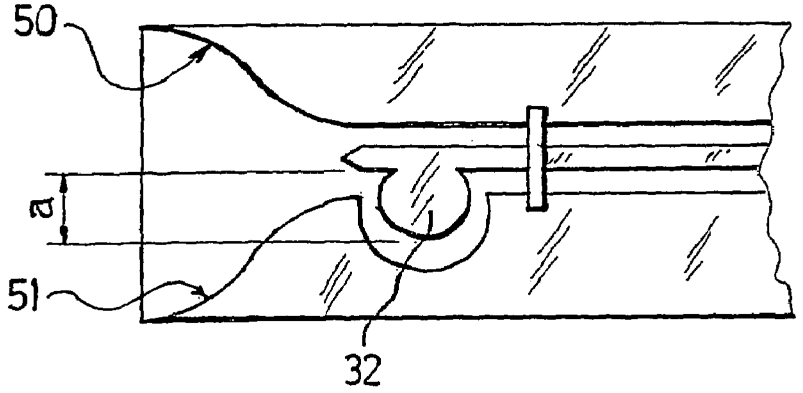
Figure 8:
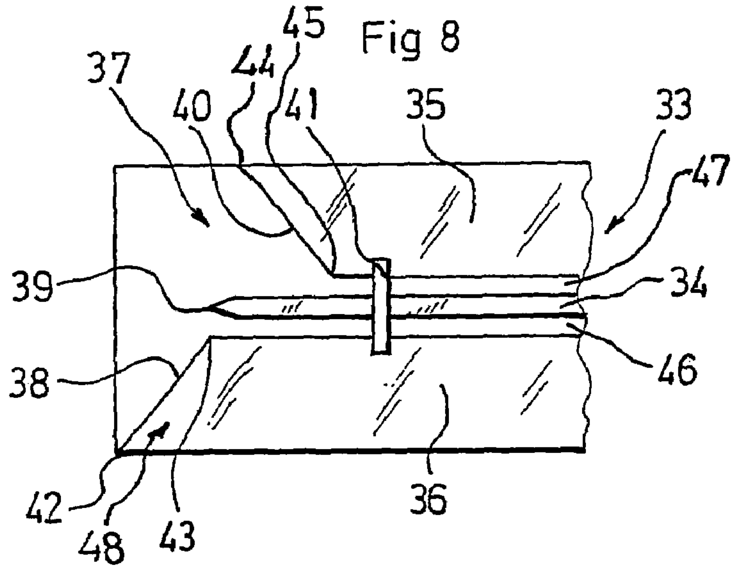
Figure 9:
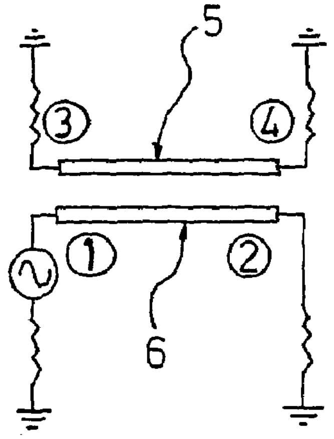

Other aims, characteristics and advantages of the invention will be made clear by the following description which relates to the attached figures showing preferred embodiments of the invention, which are provided solely by way of example and without restrictive intent, and in which:

FIG. 1 is a schematic sectional view of a transition device according to the invention, taken along a transverse plane (a plane orthogonal to the longitudinal direction of propagation of the waveguide) passing through the processing circuits, FIG. 2 is a schematic view from above of the device of FIG. 1, shown separately from any waveguide, FIG. 3 is a reproduction of FIG. 2 in which the dimensions are marked, FIG. 4 is a schematic view from below of the device of FIG. 1, shown separately from any waveguide, FIG. 5 is a schematic sectional view of the device of FIG. 1, taken along a transverse plane passing through the phase shifting means of the coplanar lines of the device, FIG. 6 is a reproduction of FIG. 5 in which the dimensions are marked, FIG. 7 is a schematic view from above of part of a coplanar line of another device according to the invention, FIG. 8 is a schematic view from above of part of a coplanar line of another device according to the invention, FIG. 9 shows a diagram of the electronic operation of the quadripole formed by two coplanar lines facing each other according to the invention.

FIGS. 1 to 6 show a device according to the invention, for transition between a receiving waveguide 1 having a cross section which is rectangular or possibly substantially square, and two processing circuits 2 and 3, each formed by a low-noise amplifier, called an LNA amplifier.

The device according to the invention comprises two coplanar lines 5 and 6 of conducting material, formed by metallization on a plate 4 of dielectric material called the substrate. The coplanar lines 5 and 6 extend on opposing parallel faces 27 and 28 of the substrate; they extend facing each other along a direction orthogonal to said faces.

The coplanar lines 5 and 6 are positioned in the waveguide 1 in such a way that the longitudinal direction of the lines is parallel to the longitudinal direction of propagation of the waveguide, and that at least the upstream part of said lines extends into the waveguide. Since the device in question is intended for a reception system, the terms "downstream" and "upstream" are used with reference to the direction of propagation of the signal, which is parallel to the longitudinal directions of the waveguide and of the coplanar lines, and with reference to the sense of propagation of the signal, this signal moving from the waveguide and the transfer ends of the coplanar lines toward the processing circuits 2 and 3.

The coplanar lines 5 and 6 preferably extend entirely in the waveguide 1.

Additionally, the coplanar lines 5 and 6 are positioned in the waveguide 1 in a median plane of the latter, to maximize the wave reception.

Each coplanar line 5 (or 6) comprises a central transmission strip 7 (or 10 respectively), and two lateral ground strips 8 and 9 (or 11 and 12 respectively) connected to ground.

Each coplanar line 5 has a connection end 17 on which the LNA amplifier 2 is mounted by what is called the "flip-chip" method, and an opposing transfer end 16 adapted to guide the electric field (in other words the electromagnetic wave) from the waveguide 1 toward the slots 21 and 22 of the coplanar line. For this purpose, the lateral ground strips 8 and 9 of the coplanar line 5 have, at the transfer end 16 of said line, respective transfer edges 13 and 14 which extend obliquely toward the outside of the line (these edges extend obliquely away from a central part of the line in both the longitudinal and the transverse direction). The transfer edges 13 and 14 thus form a funnel for the entry of the electric field into the slots 21 and 22.

In the illustrated example, the oblique transfer edges 13 and 14 project in the longitudinal direction from the central transmission strip 7. The central transmission strip 7 also terminates in a transfer edge 15 in the shape of a point. The oblique shape of the transfer edges 13 and 14 and the pointed shape of the transfer edge 15 make it possible to limit the proportion of the incident flux (transmitted by the waveguide) which is reflected by the coplanar line 5. It should be noted that the transfer end of the coplanar line 5, as defined according to the invention, corresponds to the portion of said line which extends (in the longitudinal direction) from the two lateral end points of its ground strips up to the end point 15 of its central strip.

The coplanar line 6 has connecting and transfer ends identical to those of the coplanar line 5. However, whereas the transmission strip 7 of the coplanar line 5 is continuous, the central transmission strip 10 of the coplanar line 6 is discontinuous. It is formed by two separate portions 29 and 30, aligned (in the longitudinal direction) to form extensions of each other.

The coplanar line 5, called a parallel coplanar line, is provided with a microelectromechanical switch 18, called a parallel MEM switch, which crosses over the central strip 7 and connects the two lateral strips 8 and 9 of the line. When a voltage greater than a threshold activating voltage of the MEM switch 18 is applied to said switch, the switch is pulled down until it comes into contact with the central strip 7; the strip 7 and the ground strips 8 and 9 are then electrically connected, and the parallel coplanar line 5 is neutralized by short-circuiting (and is therefore inactive). When no voltage is applied to the MEM switch 18, the transmission strip 7 can carry to the LNA amplifier 2 any current generated by the propagation of an electric field in coplanar mode in the slots 21, 22. The parallel coplanar line 5 is then active.

The coplanar line 6, called a series coplanar line, is provided with a microelectromechanical switch 19, called a series MEM switch, which forms a bridge connecting the two portions 29 and 30 of the central strip 10 of the line. When a voltage greater than a threshold activating voltage of the MEM switch 19 is applied to said switch, the switch is pulled down until it comes into contact with the face 28 of the substrate and fills the space 20 separating the two portions 29 and 30 of the strip 10. The MEM switch 19 then forms a connecting portion of the central transmission strip 10, which, on the one hand, allows the propagation of an electric field in the slots 23 and 24 between the two portions 29 and 30 of the strip, and, on the other hand, connects said portions electrically. A current is thus generated in the strip, and the series coplanar line is activated. When no voltage is applied to the series MEM switch 19, no electric field can be propagated in the slots 23 and 24 between the portions 29 and 30 of the strip 10 (the electric fields in phase opposition are globally superimposed and cancel each other out in the space 20), and the series coplanar line 6 is then inactive. Each coplanar line 5, 6 also comprises phase shifting means 25, 26, formed by a trapezium-shaped lateral extension of the central transmission strip 7, 10. This lateral extension 25, 26, called a lateral phase shifting extension, can be used to retard the electric field propagated in the slot 22, 24 adjacent to it, so as to invert the phase of this field with respect to the electric field propagated in the opposite slot 21, 23, on the other side of the transmission strip. Downstream of the lateral phase shifting extension 25 (or 26 respectively), a current can thus be generated in the central transmission strip 7 (or 10 respectively), by the fields in phase opposition propagated in the slots 21, 22 (or 23, 24 respectively), if the line is active. The lateral phase shifting extensions 25, 26 extend on opposite sides of the transmission strips 7, 10, as shown in FIG. 5. In other words, they are offset on either side of the substrate (in a direction orthogonal to the planes of the coplanar lines).

The parallel MEM switch 18 is positioned immediately downstream of the lateral phase shifting extension 25 of the parallel coplanar line. The series MEM switch 19 is positioned downstream of the lateral phase shifting extension 26 of the series coplanar line, at a distance substantially equal to $\lambda/4$ of an imaginary point chosen on the series coplanar line in such a way that the distance between this point and the lateral extension 26 is substantially equal to the distance between the parallel MEM switch 18 and the lateral extension 25 of the parallel coplanar line. In other words, the two MEM switches are offset by $\lambda/4$ on the coplanar lines, where $\lambda$ denotes a central guided wavelength carried by the coplanar line. When both coplanar lines are inactive, the standing wave rate is equivalent on both coplanar lines.

The illustrated device is intended for a system for receiving microwaves at frequencies in the range from 27 to 31 GHz. The substrate and the coplanar lines are designed to be capable of carrying these microwaves, and also to minimize the coupling phenomena of the two coplanar lines. The dimensions given below relate to FIGS. 3 and 6, in which the relative proportions of these dimensions are not necessarily reproduced:

- the width l of the coplanar lines 5 and 6, which is also equal to the internal width (the smaller side) of the waveguide 1, is in the range from 3 to 4.5 mm, enabling the device according to the invention to be incorporated into a multiple FAFR antenna; for example, it is, about 4 mm;
- the length L of each coplanar line, called the coplanar transmission length of said line, measured between the lateral extension 25 of the central transmission strip and a first connection point of the LNA amplifier (at the connection end 17 of the line), is less than 3.5 mm and is, for example, about 2.5 mm. It should be noted that the coupling phenomena of the two lines decrease when the length of the coplanar lines decreases;
- the nominal width w (width not including the lateral phase shifting extension 25, 26) of the transmission strip 7, 10 of each coplanar line is in the range from 10 to 170 μm; for example, it is, 40 μm;
- the nominal width s of each of the slots 21-24 of the coplanar lines is in the range from 10 to 150 μm; for example, it is, 50 μm;
- the preceding dimensions w and s are thus chosen to create an input impedance of 50 Ω for the LNA; however, the device according to the invention can be designed for processing circuits (and particularly LNA amplifiers) requiring other impedances (25, 75, 100 Ω); the widths w and s are adapted accordingly;
- the width d of the lateral phase shifting extension 25, 26 of each coplanar line is in the range from 1 to 3 mm; for example, it is 2.80 mm; the angle θ of the trapezoidal lateral extension is in the range from 10° to 40°; for example, it is about 25°;
- the dimension p, in the longitudinal direction, of the oblique transfer edge 13, 14 of the lateral ground strips of each coplanar line is more than 5 mm, and in particular is in the range from 5 to 13 mm; for example, it is 11 mm;
- the thickness of metallization t of the coplanar lines (central transmission strip and lateral ground strips) is in the range from 9 to 35 μm; for example, it is about 17.5 μm;
- the thickness e of the substrate is greater than 0.200 mm; it is chosen according to the electrical permittivity $\in_r$ of the constituent material of said substrate; by way of example, the substrate is made from a synthetic material known as TMM4 having an electrical permittivity $\in_r$ equal to 4.5; its thickness e is 0.508 mm or 0.762 mm. It should be noted that the parasitic coupling phenomena of the two lines decrease when the thickness e of the substrate is increased and/or when its electrical permittivity $\in_r$ is decreased. But an increase in the substrate thickness and the choice of a higher-performance material increases the production cost of the device. Conversely, the coupling decreases when the transmission length L of the line is reduced. The design of the substrate and of the coplanar lines is therefore based on a compromise between the desired performance, the economic and financial constraints and the geometric constraints imposed by the structure of the antenna.

The operation of this device according to the invention has been simulated by means of the HFSS simulation software marketed by the Ansoft Corporation, for a wave frequency band from 27 to 31 GHz.

These simulations have shown that:

- the coupling parameters $S_{41}$ and $S_{14}$ (see FIG. 9) between the input (transfer end) of a coplanar line and the output (connection end) of the other coplanar line take values of less than −10 dB over the whole frequency band, and in particular values of less than −25 dB over most of said band;
- the transmission parameters $S_{21}$ and $S_{12}$ between the input and the output of the same coplanar line take values greater than −2 dB over the whole frequency band, and in particular values greater than −0.5 dB over most of said band;
- the reflection parameter $S_{11}$ at the inputs of the coplanar lines takes values of less than −20 dB over the whole frequency band, and in particular values of less than −30 dB over most of said band;
- the insertion parameter between the waveguide (in TE10 waveguide mode) and the coplanar lines (in coplanar mode) takes values greater than −1.5 dB over the whole frequency band.

FIG. 7 shows a coplanar line of another device according to the invention, in which the phase shifting means consist of a lateral extension 32 of the central strip of the line, which takes the shape of a portion of a disk. When the device is intended for a system for receiving microwaves at frequencies in the range from 27 to 31 GHz, this lateral extension has a transverse dimension "a" greater than 0.5 mm and preferably in the range from 1 to 2.8 mm; for example, it is about 2.40 mm, the disk having a radius of about 1.4 mm.

Additionally, this coplanar line has lateral ground strips whose transfer edges 50, 51 are curved and of hyperbolic shape, in order to improve the insertion or output parameter of the electric field (between the waveguide and the slots of the active coplanar line).

FIG. 8 shows a coplanar line 33 of another device according to the invention, in which the phase shift between the fields propagated in the two slots of said coplanar line is provided by an asymmetric geometry of its transfer end 37.

The coplanar line 33 has a first lateral ground strip 36, whose transfer edge 38 projects in the longitudinal direction beyond the central transmission strip 34 and beyond the second lateral ground strip 35 of the line. As explained before, this edge 38 also extends obliquely between a central angle 43 and an extreme lateral point 42. The lateral ground strip 36 thus comprises a longitudinal extension 48 projecting beyond the other ground strip and beyond the transmission strip.

The central transmission strip 34 of the coplanar line 33 has a transfer edge 39 in the shape of a point, which extends substantially in line (in the transverse direction) with the central angle 43 of the first lateral ground strip.

Additionally, the second lateral ground strip 35 has a transfer edge 40 extending obliquely by departing longitudinally and transversely from a central point of the coplanar line, between a central angle 45 and a lateral point 44. This lateral point 44 is located in line (in the transverse direction) with the transfer point 39 of the transmission strip, or to the rear of it (in the longitudinal direction). It is also offset in the longitudinal direction with respect to the lateral point 42 of the other ground strip, by a relative distance substantially equal to $\lambda/2$ (where $\lambda$ denotes the central guided wavelength of the coplanar line and of the device).

It should be noted that the central angle 43, 45 of the lateral ground strip 36, 35 is advantageously rounded (by contrast with the illustrated example) in order to facilitate the transfer of the field into the adjacent slot 46, 47.

The transfer end 37 of the line, as defined according to the invention, corresponds to the portion of said line that extends between the end point 42 of the first lateral ground strip and the central angle 45 of the second lateral ground strip. Because of its asymmetry, the electric fields propagated in the slots 46, 47 of the line have their phases substantially opposed after the central angle 45 of the second lateral ground strip. However, the phase shifting means also comprise an air bridge 41 of conducting material, positioned downstream of the entrance of the slot 47, and in the proximity of the latter. This bridge makes it possible to eliminate any residual parasitic modes (slot mode, etc.), to provide transmission essentially in coplanar mode downstream of said bridge 41.

Clearly, the invention can be varied in numerous ways from the embodiments described above and illustrated in the figures.

In particular, the positions of the switches of the device shown in FIGS. 1 to 6 can be reversed, in the following arrangement: the series switch is positioned between the phase shifting means and the connection end of the series coplanar line, in the immediate proximity of said phase shifting means; the parallel switch is positioned between the phase shifting means and the connection end of the parallel coplanar line, at a distance from said phase shifting means, and more precisely from a point of the parallel line facing the series switch, substantially equal to one quarter of a mean propagation wavelength of the waveguide. In other words, the parallel switch is offset in a downstream direction (in reception) by a distance equal to $\lambda/4$ with respect to the series switch.

Furthermore, each coplanar line is not necessarily symmetrical (outside the phase shifting means) about its central transmission strip. On the contrary, the lateral ground strip opposite the phase shifting means (strip 8 in the illustrations) is advantageously of restricted width, to provide a device having small overall dimensions.

Additionally, the transition device according to the invention can be incorporated into a wave transmission system, in which each of the processing circuits consists of a power amplifier of the SSPA (Solid State Power Amplifier) type.

It is also possible to use a device according to the invention for other applications in reception (at hyperfrequency, and in particular in band V, around 60 GHz, but also at other frequencies), or in transmission.

The invention claimed is:

1. Redundant transition device between an electromagnetic waveguide (1) and at least two redundant circuits (2, 3), called processing circuits, this transition device comprising two coplanar lines (5, 6) formed on a plate, called a substrate, of dielectric material, each coplanar line comprising, in a same plane, a central transmission strip (7; 10) and two lateral ground strips (8, 9; 11, 12), one on each side of said transmission strip, separated from the latter by electromagnetic waveguide slots (21, 22; 23, 24), said transmission strip and ground strips extending primarily in a direction called the longitudinal line direction, each coplanar line (5) having a longitudinal end (17), called the connection end, for coupling to one (2) of the processing circuits associated with said coplanar line, wherein:

the two coplanar lines (5, 6) extend one on each side of a single substrate (4), on two principal opposite faces (27, 28) thereof, the two coplanar lines (5, 6) extend, in part at least, into the waveguide (1);

each coplanar line (5) has a longitudinal end (16), called the transfer end, opposite its connection end, adapted to channel an electromagnetic wave between the waveguide and the slots (21, 22) of said coplanar line;

each coplanar line (5, 6) is provided with means (25, 26), called phase shifting means, adapted for inverting the phase of an electric field on one side of the central transmission strip (7, 10) of said coplanar line, in order to transmit electrical energy essentially in a coplanar mode along said transmission strip between the phase shifting means and the processing circuit, and to transmit electrical energy essentially in a guide mode in the waveguide beyond the transfer end.

2. Transition device as claimed in claim 1, wherein the two coplanar lines (5, 6) extend facing each other, one on each side of the substrate (4).

3. Transition device as claimed in claim 1, wherein the two coplanar lines (5, 6) extend along a direction of propagation of the waveguide.

4. Device as claimed in claim 1, wherein the substrate (4) extends in a median longitudinal plane of the waveguide (1).

5. Transition device as claimed in claim 2, wherein each coplanar line (5, 6) is provided with a switch (18, 19) for activating or disabling said coplanar line.

6. Transition device as claimed in claim 5, intended for a reception system, wherein said switches (18, 19) are adapted to be capable of being controlled in such a way that the coplanar lines have opposite states, active in one case and inactive in the other, at each instant.

7. Transition device as claimed in claim 5, wherein:

one of the coplanar lines (6), called the series coplanar line, has an interrupted central transmission strip (10), formed from two separated portions (29, 30) extending into each others' continuation, the other coplanar line (5), called the parallel coplanar line, having a continuous central transmission strip (7), the switch (19) of the series coplanar line, called the series switch, is connected in series so as to connect the two separated portions (29, 30) of the central transmission strip, in such a way that the series coplanar line (6) is active when the series switch is in a state, called the conducting state, in which it forms an electrical connection between the two portions of the central transmission strip, the switch (18) of the parallel coplanar line, called the parallel switch, is connected in parallel so as to be capable of connecting the central transmission strip (7) to the two lateral ground strips (8, 9) of said parallel coplanar line, in such a way that the parallel coplanar line (5) is inactive when the parallel switch is in a state, called a conducting state, in which it forms an electrical connection between the central transmission strip and the lateral ground strips.

8. Transition device as claimed in claim 5, wherein at least one switch comprises a diode.

9. Transition device as claimed in claim 5, wherein at least one switch (18, 19) is a microelectromechanical switch, called a MEM switch.

10. Transition device as claimed in claim 5, wherein the switches (18, 19) of the two coplanar lines are offset, along a longitudinal direction of the substrate, by a relative distance substantially equal to one quarter of a wavelength called the guided wavelength of the device.

11. Transition device as claimed in claim 1, wherein at least one lateral ground strip (8, 9) of each coplanar line has, at the transfer end (16) of said line, a terminal edge (13, 14), called the transfer edge of the strip, which extends obliquely by departing transversely and longitudinally from a central part of the coplanar line.

12. Transition device as claimed in claim 11, wherein the transfer edge (13, 14) of a lateral ground strip (8, 9) extends by projecting from the central transmission strip (7) of the coplanar line, in the longitudinal line direction.

13. Transition device as claimed in claim 11, wherein the transfer edge (50, 51) of a lateral ground strip has a curved shape which is rounded or exponential or hyperbolic.

14. Transition device as claimed in claim 1, wherein the transmission strip (7) of each coplanar line has, at the transfer end (16) of said line, a terminal edge (15), called the transfer edge of the transmission strip, forming a point.

15. Transition device as claimed in claim 1, wherein the phase shifting means (25, 26) of the coplanar lines are adapted to invert the phase of an electric field on opposite sides of the central transmission strips.

16. Transition device as claimed in claim 1, wherein the phase shifting means of at least one coplanar line (5, 6) are formed by a lateral extension (25, 26) of the central transmission strip (7, 10) of said coplanar line, called a lateral phase shifting extension.

17. Transition device as claimed in claim 1, wherein the phase shifting means of at least one coplanar line are formed by two consecutive lateral extensions of its central transmission strip, which extend on the same side of said strip and are adapted so that each creates a phase shift of the electric field of about $\pi/2$.

18. Transition device as claimed in claim 16, wherein at least one lateral phase shifting extension (25, 26) of a central transmission strip is trapezoidal in shape.

19. Transition device as claimed in claim 16, wherein at least one lateral phase shifting extension (32) of a central transmission strip takes the form of a portion of a disk.

20. Transition device as claimed in claim 1, wherein the phase shifting means of at least one coplanar line comprise, on the one hand, a longitudinal extension (46) of one (36) of the lateral ground strips, this longitudinal extension extending by projection along the longitudinal line direction beyond the other lateral ground strip (35) and beyond the central transmission strip (34) of the coplanar line, at the transfer end (37) of the latter, and, on the other hand, a bridge (41) of conducting material, called an air bridge, crossing over the central transmission strip and connecting the two lateral ground strips.

21. Transition device as claimed in claim 1, wherein the phase shifting means (25, 26) of the two coplanar lines are of the same type.

22. Transition device as claimed in claim 1, wherein the central transmission strip (7) and the slots (21, 22) of each coplanar line have respective nominal widths adapted to make the input impedance of the processing circuit (2) optimal in terms of noise limitation.

23. Transition device as claimed in claim 1, wherein the central transmission strip and the slots of each coplanar line have respective nominal widths adapted to make the input impedance of a LNA amplifier equal to 50 Ω.

24. Transition device as claimed in claim 1, for an antenna for receiving microwaves at frequencies in the range from 27 to 31 GHz, wherein the substrate (4) has an electrical permittivity $\in_r$ of less than 5 and a thickness (e) of more than 0.5 mm, and wherein each coplanar line (5, 6) has a central transmission strip (7, 10) with a length (L) of less than 3.5 mm between the phase shifting means and a first point of connection to the processing circuit.

25. Transition device as claimed in claim 1, for an antenna for receiving microwaves at frequencies in the range from 45 to 50 GHz, wherein the substrate (4) has an electrical permittivity $\in_r$ of less than 5 and a thickness (e) of more than 0.5 mm, and wherein each coplanar line (5, 6) has a central transmission strip (7, 10) with a length (L) of less than 3 mm between the phase shifting means and a first point of connection to the processing circuit.

* * * * *